US008207597B2

(12) United States Patent  
Punzalan et al.

(10) Patent No.: US 8,207,597 B2
(45) Date of Patent: Jun. 26, 2012

(54) INTEGRATED CIRCUIT PACKAGE SYSTEM WITH FLASHLESS LEADS (75) Inventors: Jeffrey D. Punzalan, Singapore (SG); Henry D. Bathan, Singapore (SG); Il Kwon Shim, Singapore (SG); Zigmund Ramirez Camacho, Singapore (SG)

(73) Assignee: STATS ChipPAC Ltd., Singapore (SG)

( * ) Notice: Subject to any disclaimer, the term of this patent is extended or adjusted under 35 U.S.C. 154(b) by 559 days.

(21) Appl. No.: 11/670,899

(22) Filed: Feb. 2, 2007

(65) Prior Publication Data

US 2008/0012100 A1 Jan. 17, 2008

Related U.S. Application Data (60) Provisional application No. 60/807,461, filed on Jul. 14, 2006.

(51) Int. Cl.
*H01L 23/495* (2006.01)

(52) U.S. Cl. . 257/666; 257/669; 257/670; 257/E23.031; 257/E23.032; 257/E23.043

(58) Field of Classification Search .................. 257/666, 257/E23.043, E23.031, E23.032, 669, 670
See application file for complete search history.

(56) References Cited

U.S. PATENT DOCUMENTS

| | | | |
|---|---|---|---|
| 5,763,942 A * | 6/1998 | Suzuki | 257/669 |
| 6,150,709 A * | 11/2000 | Shin et al. | 257/666 |
| 6,331,453 B1 | 12/2001 | Bolken et al. | |
| 6,674,156 B1 * | 1/2004 | Bayan et al. | 257/670 |
| 6,696,749 B1 * | 2/2004 | Hung et al. | 257/669 |
| 6,773,961 B1 | 8/2004 | Lee et al. | |
| 6,924,548 B2 * | 8/2005 | Hasebe et al. | 257/674 |
| 7,087,461 B2 * | 8/2006 | Park et al. | 438/112 |
| 7,125,747 B2 | 10/2006 | Lee et al. | |
| 2002/0031869 A1 * | 3/2002 | Minamio et al. | 438/127 |
| 2002/0041010 A1 * | 4/2002 | Shibata | 257/666 |
| 2002/0121670 A1 * | 9/2002 | Minamio et al. | 257/459 |
| 2006/0033184 A1 * | 2/2006 | Park et al. | 257/666 |
| 2006/0234426 A1 | 10/2006 | Lau | |
| 2006/0249830 A1 * | 11/2006 | Shim et al. | 257/690 |
| 2007/0108567 A1 * | 5/2007 | Alabin et al. | 257/676 |

* cited by examiner

*Primary Examiner* — Eugene Lee
*Assistant Examiner* — Peniel M Gumedzoe
(74) *Attorney, Agent, or Firm* — Ishimaru & Associates LLP; Mikio Ishimaru; Stanley Chang (57) ABSTRACT An integrated circuit package system is provided including forming a lead frame including forming an inner lead having a planar surface, the inner lead extending inwardly from the lead frame and forming a stiffening structure integral with the lead frame for maintaining the planar surface; encapsulating the inner lead with an electrical connection to an integrated circuit die and with a first inner lead body of the inner lead exposed; and singulating the inner lead from the lead frame.

19 Claims, 9 Drawing Sheets

INTEGRATED CIRCUIT PACKAGE SYSTEM WITH FLASHLESS LEADS

CROSS-REFERENCE TO RELATED APPLICATION

This application claims the benefit of U.S. Provisional Patent Application Ser. No. 60/807,461 filed Jul. 14, 2006.

TECHNICAL FIELD

The present invention relates generally to semiconductor technology, and more particularly to an integrated circuit thin package system.

BACKGROUND ART

Increased miniaturization of components, and greater packaging density of integrated circuits ("ICs"), higher performance, and lower cost are ongoing goals of the computer industry. As new generations of IC products are released, the number of devices used to fabricate them tends to decrease due to advances in technology. Simultaneously, the functionality of these products increases.

Semiconductor package structures continue to advance toward miniaturization and thinning to increase the density of the components that are packaged therein while decreasing the sizes of the products that are made therefrom. This is in response to continually increasing demands on information and communication apparatus for ever-reduced sizes, thicknesses, and costs, along with ever-increasing performance.

These increasing requirements for miniaturization are particularly noteworthy, for example, in portable information and communication devices such as cellular phones, hands-free cellular phone headsets, personal data assistants ("PDA's"), camcorders, notebook personal computers, and so forth. All of these devices continue to be made smaller and thinner to improve their portability. Accordingly, large scale IC ("LSI") packages that are incorporated into these devices are required to be made smaller and thinner, and the package configurations that house and protect them are required to be made smaller and thinner as well.

Many conventional semiconductor die (or "chip") packages are of the type where a semiconductor die is molded into a package with a resin, such as an epoxy molding compound. The packages have a lead frame whose out leads are projected from the package body, to provide a path for signal transfer between the die and external devices. Other conventional package configurations have contact terminals or pads formed directly on the surface of the package.

Such a conventional semiconductor package is fabricated through the following processes: a die-bonding process (mounting the semiconductor die onto the paddle of a lead frame), a wire-bonding process (electrically connecting the semiconductor die on the paddle to inner leads using lead frame wires), a molding process (encapsulating a predetermined portion of the assembly, containing the die, inner leads and lead frame wires, with an epoxy resin to form a package body), and a trimming process (completing each assembly as individual, independent packages).

The semiconductor packages, thus manufactured, are then mounted by matching and soldering the external leads or contact pads thereof to a matching pattern on a circuit board, to thereby enable power and signal input/output ("I/O") operations between the semiconductor devices in the packages and the circuit board.

An exemplary semiconductor package, well known in the electronics industry, is the quad flat no-lead package ("QFN"). QFN packages typically comprise a lead frame, such as a conductive sheet stamped and etched, with a semiconductor die having a multitude of bond pads mounted to the top side of the lead frame. Wire bonds electrically connect the bond pads, of the semiconductor die, to a series of conductive lead fingers on the top side of the lead frame. Typically, the semiconductor die and the wire bonds are encapsulated within a molding compound.

In order to reduce manufacturing costs, the electronics industry is increasing the usage of QFN packages. In the manufacturing process, many obstacles must be overcome to deliver extremely small packages in high volume. One such obstacle is mold flash covering some of the inner lead contacts and preventing a reliable printed circuit board connection. This situation may be caused by debris on the mold bottom chase under the lead fingers or the clamping pressure on one end of a half etched lead causes the other end to lift. Another possibility is that the lead fingers may be bent or lifted prior to the molding step. The result of these issues is that the finished package may be missing some of the contact pads necessary to connect it to the printed circuit board.

Still thinner, smaller, and lighter package designs and mounting/connecting configurations have been adopted in response to continuing requirements for further miniaturization. At the same time, users are demanding semiconductor packages that are more reliable under increasingly severe operating conditions.

Thus, a need still remains for an integrated circuit package system providing low cost manufacturing, improved yield, and thinner height for the integrated circuits. In view of the ever-increasing need to save costs and improve efficiencies, it is more and more critical that answers be found to these problems.

Solutions to these problems have been long sought but prior developments have not taught or suggested any solutions and, thus, solutions to these problems have long eluded those skilled in the art.

DISCLOSURE OF THE INVENTION

The present invention provides an integrated circuit package system including forming a lead frame including forming an inner lead having a planar surface, the inner lead extending inwardly from the lead frame, and forming a stiffening structure integral with the lead frame for maintaining the planar surface; encapsulating the inner lead with an electrical connection to an integrated circuit die and with a first inner lead body of the inner lead exposed; and singulating the inner lead from the lead frame.

Certain embodiments of the invention have other aspects in addition to or in place of those mentioned or obvious from the above. The aspects will become apparent to those skilled in the art from a reading of the following detailed description when taken with reference to the accompanying drawings.

BEST MODE FOR CARRYING OUT THE INVENTION

The following embodiments are described in sufficient detail to enable those skilled in the art to make and use the invention. It is to be understood that other embodiments would be evident based on the present disclosure, and that system, process, or mechanical changes may be made without departing from the scope of the present invention.

In the following description, numerous specific details are given to provide a thorough understanding of the invention. However, it will be apparent that the invention may be practiced without these specific details. In order to avoid obscuring the present invention, some well-known circuits, system configurations, and process steps are not disclosed in detail. Likewise, the drawings showing embodiments of the system are semi-diagrammatic and not to scale and, particularly, some of the dimensions are for the clarity of presentation and are shown greatly exaggerated in the drawing FIGS. In addition, where multiple embodiments are disclosed and described having some features in common, for clarity and ease of illustration, description, and comprehension thereof, similar and like features one to another will ordinarily be described with like reference numerals.

For expository purposes, the term "horizontal" as used herein is defined as a plane parallel to the plane or surface of the integrated circuit, regardless of its orientation. The term "vertical" refers to a direction perpendicular to the horizontal as just defined. Terms, such as "above", "below", "bottom", "top", "side" (as in "sidewall"), "higher", "lower", "upper", "over", and "under", are defined with respect to the horizontal plane. The term "on" means there is direct contact among elements. The term "processing" as used herein includes deposition of material, patterning, exposure, development, etching, cleaning, molding, and/or removal of the material or as required in forming a described structure. The term "system" as used herein means and refers to the method and to the apparatus of the present invention in accordance with the context in which the term is used.

Figure 1:
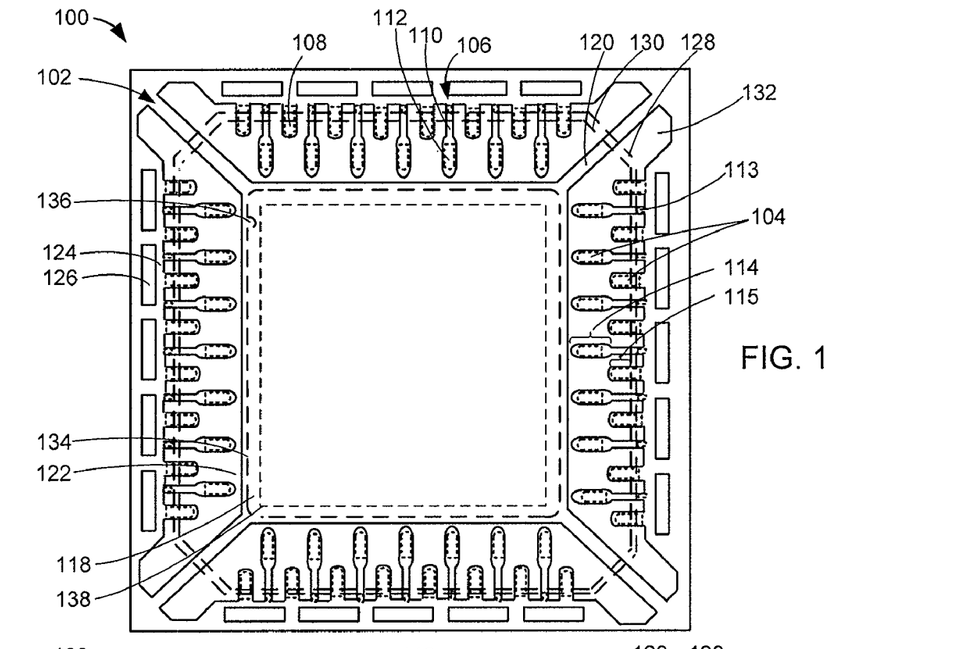
FIG. 1 is a plan view of an integrated circuit package system in a lead frame in an embodiment of the present invention.

Referring now to FIG. 1, therein is shown a plan view of an integrated circuit package system 100 in a lead frame 102 in an embodiment of the present invention. The plan view depicts the integrated circuit package system 100 as unsingulated from the lead frame 102. The lead frame 102 has dual rows of external interconnects 104. An inner row of the external interconnects 104 has inner leads 106. An outer row of the external interconnects 104 has outer leads 108.

Each of the inner leads 106 has an inner lead tip 110 that may be formed by a number of processes, such as half etching. The formation of the inner lead tip 110 also forms a first inner lead body 112 and a second inner lead body 113. The first inner lead body 112 and the second inner lead body 113 are at opposite ends of the inner leads 106 with the inner lead tip 110 in between. The first inner lead body 112 is towards an interior of the integrated circuit package system 100 and the second inner lead body 113 is towards a periphery of the integrated circuit package system 100. The first inner lead body 112 is thicker than the inner lead tip 110. The second inner lead body 113 has substantially the same width as the inner lead tip 110.

The inner leads 106 and the outer leads 108 are at alternating locations to one another. The dimensions of the inner leads 106 and the outer leads 108 are complementary. The complementary dimensions provide a high density of the external interconnects 104. The second inner lead body 113 are towards the periphery of the integrated circuit package system 100 without the inner leads 106 contacting the outer leads 108. The first inner lead body 112 is towards the interior of the integrated circuit package system 100 without the inner leads 106 contacting the outer leads 108. In overview, the inner lead 106 has a planar surface width broader at an inner end portion 114 of the inner lead 106 inward in the lead frame 102 and the outer lead 108 has a consistent planar surface width to an outer end portion 115 of the outer lead 108 inward in the lead frame 102.

The integrated circuit package system 100 also includes a paddle 118, such as a die-attach paddle. Tie bars 120 attach to corners of the paddle 118. Openings 122 are the space in the lead frame 102 between the external interconnects 104, the paddle 118, and the tie bars 120. Dam bars 124 are between the openings 122 and slots 126, such as stress relief slots. The dam bars 124 help prevent molding material from flowing over the external interconnects 104 upon encapsulating.

A singulation outline 128 depicted by the dotted line shows the singulation boundary of the lead frame 102. The dam bars 124, portions of the external interconnects 104, and portions of the tie bars 120 are removed upon singulation forming the integrated circuit package system 100. A mold outline 130 depicted by the dotted line within the singulation outline 128 shows the outline of an encapsulation 132, such as an epoxy mold compound, of the integrated circuit package system 100. The encapsulation 132 fills the openings 122.

A paddle outline 134 depicted by a dotted line within the paddle 118 shows a bottom peripheral region of the paddle 118 that is half etched. A recess 136 in the paddle outline 134 may represent the pin 1 location of the integrated circuit package system 100. An integrated circuit die 138 is over the paddle 118 and in the encapsulation 132.

Figure 2:
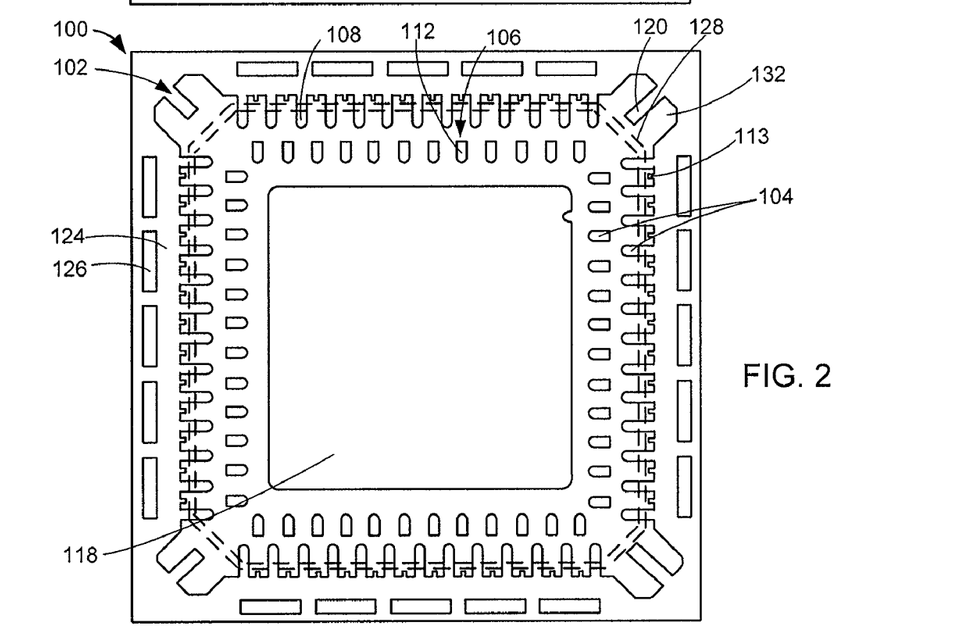
FIG. 2 is a bottom view of the integrated circuit package system of FIG. 1.

Referring now to FIG. 2, therein is shown a bottom view of the integrated circuit package system 100 of FIG. 1. The bottom view depicts the integrated circuit package system 100 as unsingulated from the lead frame 102. The lead frame 102 has the external interconnects 104. The external interconnects 104 are in dual rows with the inner leads 106 the outer leads 108.

The encapsulation 132 fills the openings 122 of FIG. 1 while exposing the first inner lead body 112, the second inner lead body 113, and the outer leads 108. The encapsulation 132 covers the inner lead tip 110 of FIG. 1. The paddle 118 and portions of the tie bars 120 are exposed by the encapsulation 132. The bottom view also depicts the second inner lead body 113 outside the singulation outline 128, the dam bars 124, and the slots 126.

Figure 3:
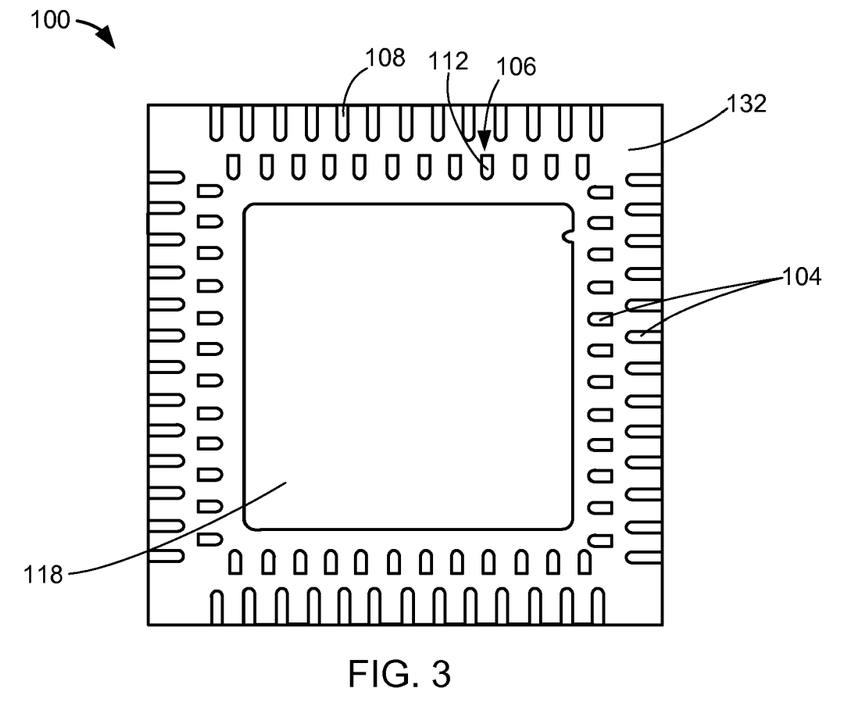
FIG. 3 is a bottom view the integrated circuit package system singulated from the lead frame of FIG. 1.

Referring now to FIG. 3, therein is shown a bottom view the integrated circuit package system 100 singulated from the lead frame 102 of FIG. 1. The singulation separates the integrated circuit package system 100 from the lead frame 102 of FIG. 1 removing the second inner lead body 113 of FIG. 1, the dam bars 124 of FIG. 1, and the slots 126 of FIG. 1.

The bottom view depicts the external interconnects 104 in the dual rows of the inner leads 106 the outer leads 108. The encapsulation 132 exposes the first inner lead body 112 and the outer leads 108 for further connections to the next system level (not shown), such as a printed circuit board or another integrated circuit package system. The encapsulation 132 covers the inner lead tip 110 of FIG. 1. The paddle 118 is exposed by the encapsulation 132.

Figure 4:
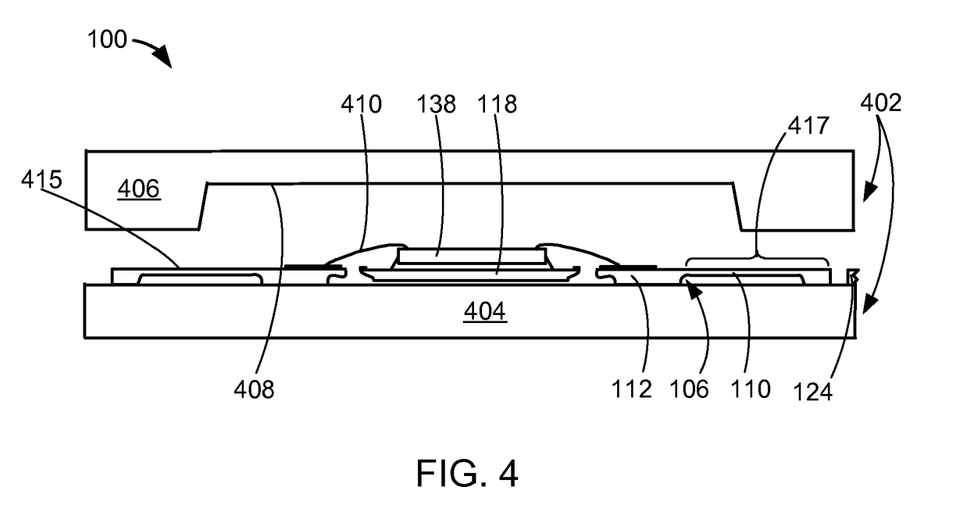
FIG. 4 is a cross-sectional view of the integrated circuit package system of FIG. 1 in a molding phase.

Referring now to FIG. 4, therein is shown a cross-sectional view of the integrated circuit package system 100 along a line segment 4-4 of FIG. 2 in a mold mount phase. The integrated circuit package system 100 is placed in a mold chase 402 and on a bottom chase 404 of the mold chase. The inner leads 106 are over the bottom chase 404 with the inner lead tip 110 between the first inner lead body 112 and the second inner lead body 113. A top chase 406 has a cavity 408 for the encapsulation 132 of FIG. 1.

The integrated circuit die 138 is over the paddle 118. Internal interconnects 410, such as bond wires, connect the integrated circuit die 138 and the first inner lead body 112. The paddle 118, the integrated circuit die 138, and the internal interconnects 410 are below the cavity 408. The internal interconnects 410 also connect the integrated circuit die 138 and the outer leads 108 of FIG. 1. The outer leads 108 are also over the bottom chase 404 in this phase.

For illustrative purposes, the integrated circuit die 138 is shown as an integrated circuit die, although it is understood that the integrated circuit die 138 may be a different device type, such as a packaged integrated circuit or a stack of integrated circuits. Also for illustrative purposes, the internal interconnects 410 are shown as bond wires, although it is understood that the internal interconnects 410 may be different, such as solder balls for a flip chip.

Each of the inner leads 106 has a planar surface 415 at the upper surface of the inner leads 106. The planar surface 415 includes the inner lead tip 110, the first inner lead body 112, and the second inner lead body 113. As the bottom chase 404 and the top chase 406 clamps the inner leads 106 for molding, the planar surface 415 remains planar and coplanar between the inner leads 106 to avoid mold flash. The planar surface 415 also provides for planarity of the first inner lead body 112. A stiffening structure 417 for each of the inner leads 106 includes the dam bars 124, the slots 126 of FIG. 1, and the second inner lead body 113 of FIG. 1. The stiffening structure 417 maintains the planar surface 415.

Figure 5:
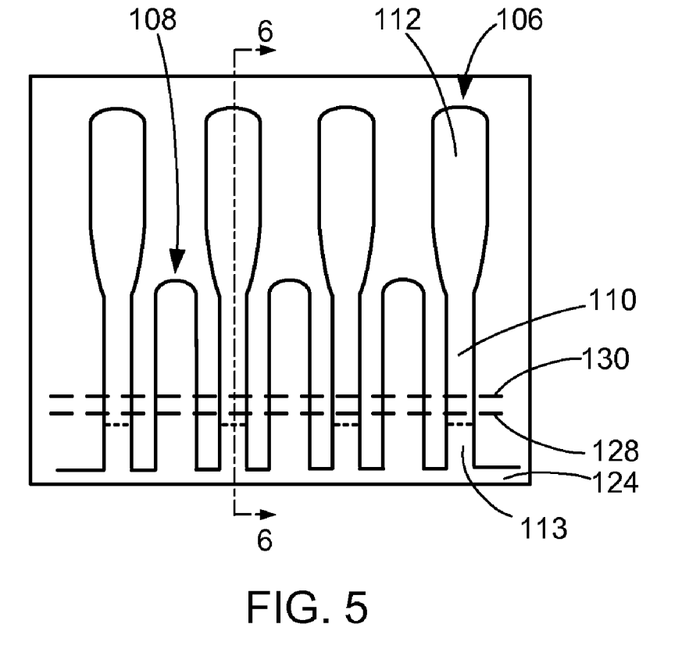
FIG. 5 is a more detailed plan view of the external interconnects of FIG. 1.

Referring now to FIG. 5, therein is shown a more detailed plan view of the external interconnects 104 of FIG. 1. The more detailed plan view depicts the inner leads 106, the outer leads 108, and the dam bars 124. Each of the inner leads 106 has the inner lead tip 110 between the first inner lead body 112 and the second inner lead body 113. This plan view depicts the second inner lead body 113 below the singulation outline 128 and the mold outline 130. The first inner lead body 112 preferably includes a tapered side along at least a portion of one or more sides tapered, angled, or non-orthogonally extended facing the outer leads 108. The tapered side tapering towards the lead frame. The tapered side can extend from a full width in a section without facing sides of the outer leads 108 to a width of the inner lead tip 110 in a section with facing sides of the outer leads 108 providing surface area for planarity during processing or spacing for electrical isolation.

Figure 6:
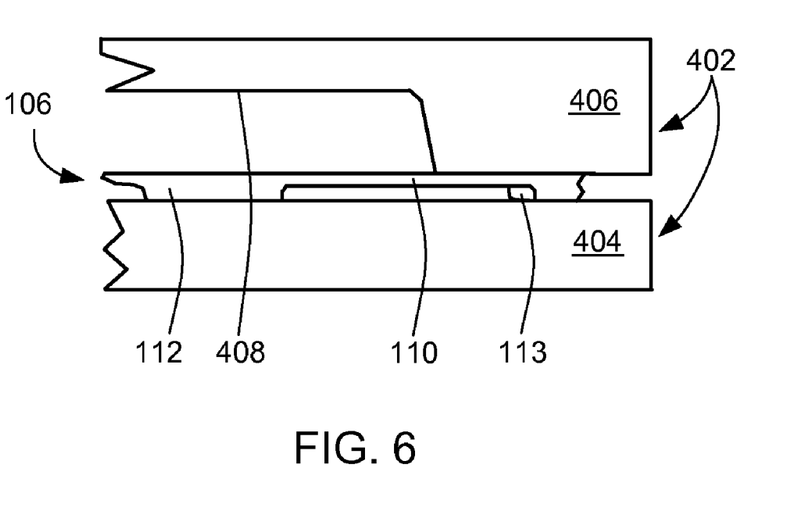
FIG. 6 is a cross-sectional view of the inner lead along 6-6 of FIG. 5 in the mold chase.

Referring now to FIG. 6, therein is shown a cross-sectional view of the inner lead along 6-6 of FIG. 5 in the mold chase 402. The cross-sectional view depicts one of the inner leads 106 between the bottom chase 404 and the top chase 406. The first inner lead body 112 is in the cavity 408 and the second inner lead body 113 is not in the cavity 408.

As the integrated circuit package system 100 of FIG. 1 undergo molding, the top chase 406 and the bottom chase 404 clamps together holding the lead frame 102 of FIG. 1 in place. The clamping force may result in mold flash with some of the inner leads 106 covered by the encapsulation 132 of FIG. 1. The second inner lead body 113 as part of the stiffening structure 417 of FIG. 4 helps resist, mitigate, or eliminate bending of the inner leads 106 preventing mold flash of the first inner lead body 112.

Figure 7:
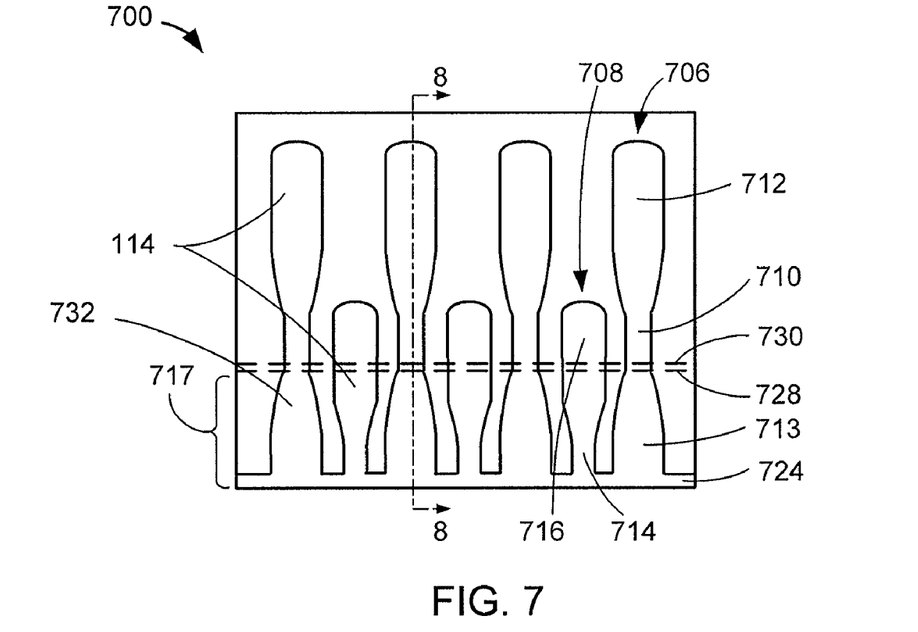
FIG. 7 is a plan view external interconnects in an alternative embodiment of the present invention.

Referring now to FIG. 7, therein is shown a plan view external interconnects 700 in an alternative embodiment of the present invention. The external interconnects 700 may be part of the integrated circuit package system 100 of FIG. 1. The plan view depicts the external interconnects 700 including inner leads 706 and outer leads 708. The plan view also depicts a dam bar 724. Each of the inner leads 706 has an inner lead tip 710 between a first inner lead body 712 and a second inner lead body 713. Each of the outer leads 708 has an outer lead tip 714 and an outer lead body 716. The outer lead tip 714 attaches to the dam bar 724 and at the opposite end of each of the outer leads 708 with the outer lead body 716.

The second inner lead body 713 extends laterally such that the width of the second inner lead body 713 is wider than the width of the inner lead tip 710. The width of the outer lead body 716 is wider than the width of the outer lead tip 714. A stiffening structure 717 for each of the inner leads 706 includes the dam bar 724 and the second inner lead body 713.

This plan view also depicts the second inner lead body 713 below a singulation outline 728 and a mold outline 730. The inner leads 706 and the outer leads 708 have similar relationship to each other as the inner leads 106 of FIG. 1 and the outer leads 108 of FIG. 1. In overview, the outer lead 708 has a planar surface width broader at the outer end portion 115 inward in the lead frame 102 and the inner lead 706 has a planar surface width narrower between the inner end portion 114 away from the lead frame and an inner bottom portion 732 outward in the lead frame 102 towards the dam bar 724. The first inner lead body 712 can form from the inner end portion 114 of FIG. 1. The second inner lead body 713 can form from the inner bottom portion 732. The outer lead body 716 can form from the outer end portion 115.

Figure 8:
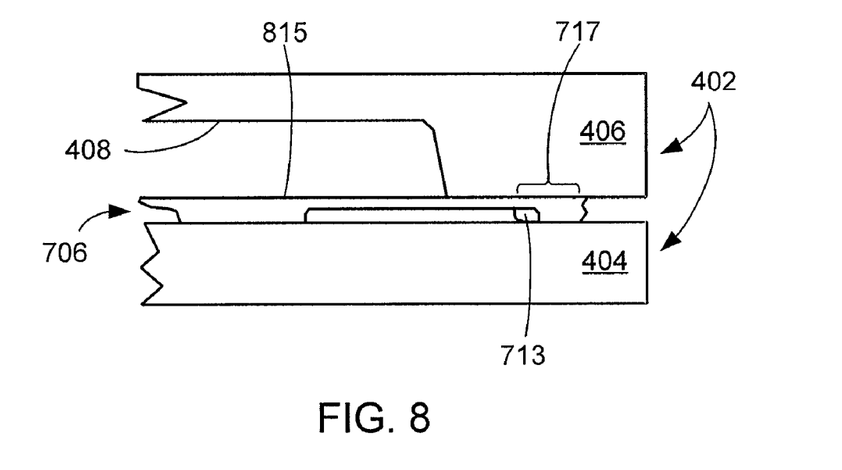
FIG. 8 is a cross-sectional view of the external interconnects along a line 8-8 of FIG. 7 in the mold chase.

Referring now to FIG. 8, therein is shown a cross-sectional view of the external interconnects 700 along a line 8-8 of FIG. 7 in the mold chase 402. The cross-sectional view depicts one of the inner leads 706 between the bottom chase 404 and the top chase 406. The first inner lead body 712 is in the cavity 408 and the second inner lead body 713 is not in the cavity 408.

As the integrated circuit package system 100 of FIG. 1 undergo molding, the top chase 406 and the bottom chase 404 clamps together holding the lead frame 102 of FIG. 1 in place. The clamping force may result in mold flash with some of the inner leads 706 covered by the encapsulation 132 of FIG. 1. The increased width of the second inner lead body 713 helps resist, mitigate, or eliminate bending of the inner leads 706 preventing mold flash of the first inner lead body 712. The stiffening structure 717 of FIG. 7 maintains a planar surface 815 of each of the inner leads 706.

Figure 9:
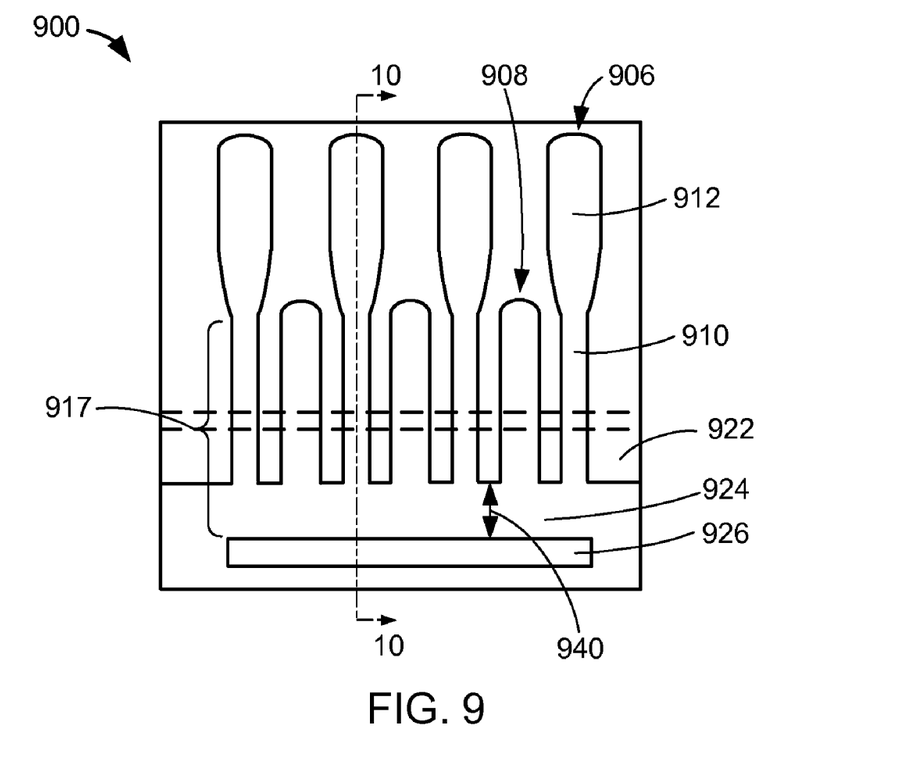
FIG. 9 is a plan view external interconnects in another alternative embodiment of the present invention.

Referring now to FIG. 9, therein is shown a plan view external interconnects 900 in another alternative embodiment of the present invention. The external interconnects 900 may be part of the integrated circuit package system 100 of FIG. 1. The plan view depicts the external interconnects 900 including inner leads 906 and outer leads 908. The plan view also depicts a dam bar 924, an opening 922, and a slot 926. Each of the inner leads 906 has an inner lead tip 910 and an inner lead body 912, wherein the inner lead tip 910 is attached to the dam bar 924.

The plan view depicts the slot 926 further away from the opening 922 next to a side of the dam bar 924 having the inner lead tip 910 attached thereon, increasing a length 940 of the dam bar 924 compared to the length of the dam bars 124 of FIG. 1. A stiffening structure 917 for each of the inner leads 906 includes the dam bar 924 and the inner lead tip 910. The stiffening structure 917 has of the length 940 to a slot length, along the same line of the length 940, of the slot 926 in a ratio at least of 0.65:1. The inner leads 906 and the outer leads 908 have similar relationship to each other as the inner leads 106 of FIG. 1 and the outer leads 108 of FIG. 1.

Figure 10:
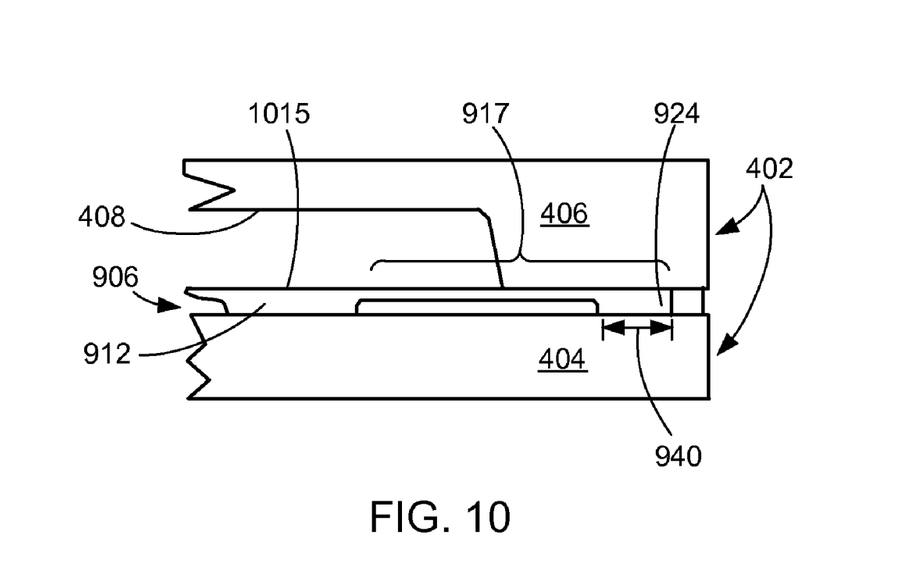
FIG. 10 is a cross-sectional view of the external interconnects along a line 10-10 of FIG. 9 in the mold chase.

Referring now to FIG. 10, therein is shown a cross-sectional view of the external interconnects 900 along a line 10-10 of FIG. 9 in the mold chase 402. The cross-sectional view depicts one of the inner leads 906 between the bottom chase 404 and the top chase 406. The inner lead body 912 is in the cavity 408. The dam bar 924 is between the bottom chase 404 and the top chase 406 outside the cavity 408.

As the integrated circuit package system 100 of FIG. 1 undergo molding, the top chase 406 and the bottom chase 404 clamps together holding the lead frame 102 of FIG. 1 in place. The clamping force may result in mold flash with some of the inner leads 906 covered by the encapsulation 132 of FIG. 1. The dam bar 924 having the length 940 of the stiffening structure 917 of FIG. 9 helps resist, mitigate, or eliminate bending of the inner leads 906 preventing mold flash of the inner lead body 912. The stiffening structure 917 maintains a planar surface 1015 of each of the inner leads 906.

Figure 11:
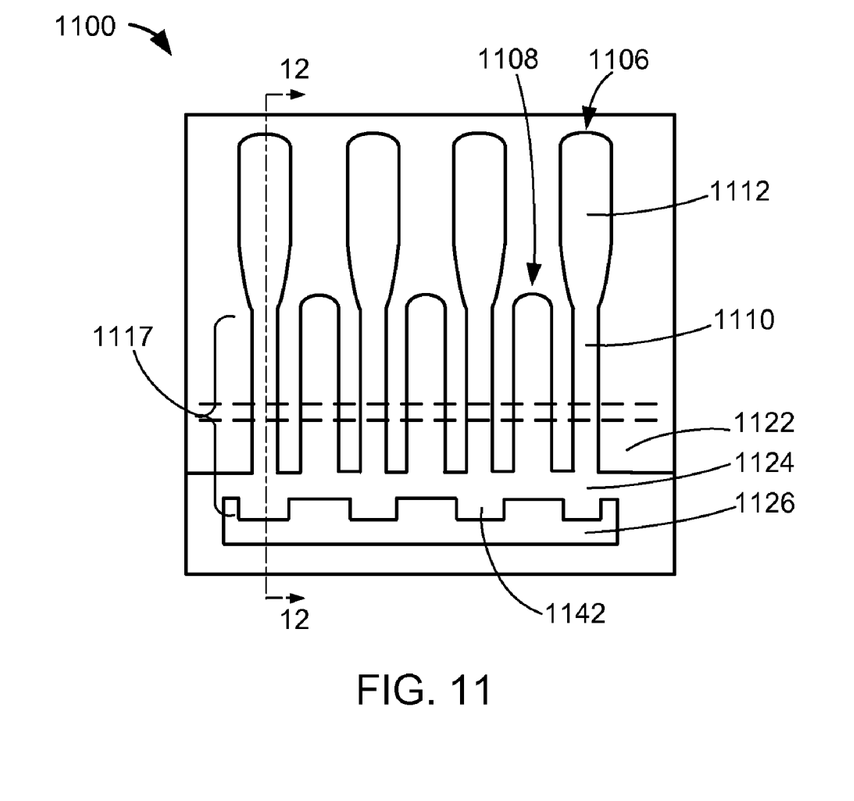
FIG. 11 is a plan view external interconnects in yet another alternative embodiment of the present invention.

Referring now to FIG. 11, therein is shown a plan view external interconnects 1100 in yet another alternative embodiment of the present invention. The external interconnects 1100 may be part of the integrated circuit package system 100 of FIG. 1. The plan view depicts the external interconnects 1100 including inner leads 1106 and outer leads 1108. The plan view also depicts a dam bar 1124, an opening 1122, and a slot 1126. Each of the inner leads 1106 has an inner lead tip 1110 and an inner lead body 1112, wherein the inner lead tip 1110 is attached to the dam bar 1124.

The plan view depicts the slot 1126 having protrusions 1142 staggered in the slot 1126 for providing additional stress relieve to the inner leads 1106. The protrusions 1142 are adjacent to the inner leads 1106. A stiffening structure 1117 for each of the inner leads 1106 includes the dam bar 1124 and the protrusions 1142 in the slot 1126. The inner leads 1106 and the outer leads 1108 have similar relationship to each other as the inner leads 106 of FIG. 1 and the outer leads 108 of FIG. 1.

Figure 12:
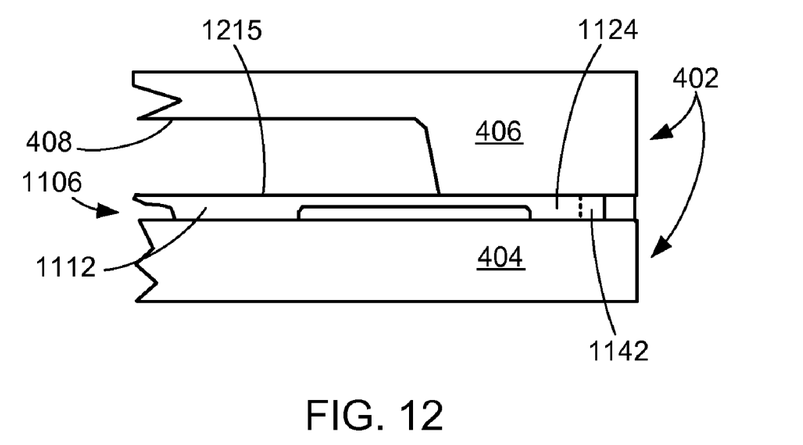
FIG. 12 is a cross-sectional view of the external interconnects along a line 12-12 of FIG. 11 in the mold chase.

Referring now to FIG. 12, therein is shown a cross-sectional view of the external interconnects 1100 along a line 12-12 of FIG. 11 in the mold chase 402. The cross-sectional view depicts one of the inner leads 1106 between the bottom chase 404 and the top chase 406. The inner lead body 1112 is in the cavity 408. The dam bar 1124 and the protrusions 1142 are between the bottom chase 404 and the top chase 406 outside the cavity 408. The boundary of the protrusions 1142 from the dam bar 1124 is shown as a dotted line.

As the integrated circuit package system 100 of FIG. 1 undergo molding, the top chase 406 and the bottom chase 404 clamps together holding the lead frame 102 of FIG. 1 in place. The clamping force may result in mold flash with some of the inner leads 1106 covered by the encapsulation 132 of FIG. 1. The stiffening structure 1117, such as the dam bar 1124 and the protrusions 1142, helps resist, mitigate, or eliminate bending of the inner leads 1106 preventing mold flash of the inner lead body 1112. The stiffening structure 1117 of FIG. 1 maintains a planar surface 1215 of each of the inner leads 1106.

Figure 13:
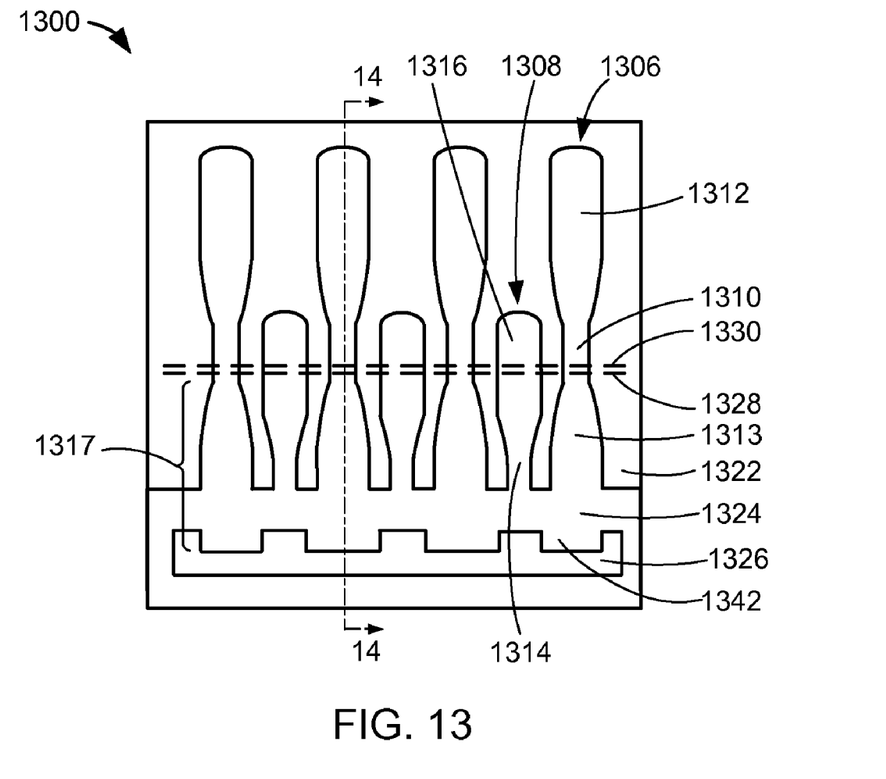
FIG. 13 is a plan view external interconnects in yet another alternative embodiment of the present invention.

Referring now to FIG. 13, therein is shown a plan view external interconnects 1300 in yet another alternative embodiment of the present invention. The external interconnects 1300 may be part of the integrated circuit package system 100 of FIG. 1. The plan view depicts the external interconnects 1300 including inner leads 1306 and outer leads 1308. The plan view also depicts a dam bar 1324, an opening 1322, and a slot 1326. Each of the inner leads 1306 has an inner lead tip 1310 between a first inner lead body 1312 and a second inner lead body 1313. Each of the outer leads 1308 has an outer lead tip 1314 and an outer lead body 1316. The outer lead tip 1314 attaches to the dam bar 1324 and the outer lead body 1316 is at the opposite end of the outer leads 1308.

The second inner lead body 1313 extends laterally such that the width of the second inner lead body 1313 is wider than the width of the inner lead tip 1310. The width of the outer lead body 1316 is wider than the width of the outer lead tip 1314. A stiffening structure 1317 for each of the inner leads 1306 includes the dam bar 1324, the second inner lead body 1313, and protrusions 1342 in the slot 1326. This plan view also depicts the second inner lead body 1313 below a singulation outline 1328 and a mold outline 1330.

The plan view further depicts the slot 1326 having the protrusions 1342 staggered in the slot 1326 for providing additional stress relieve to the inner leads 1306. The inner leads 1306 and the outer leads 1308 have similar relationship to each other as the inner leads 106 of FIG. 1 and the outer leads 108 of FIG. 1.

Figure 14:
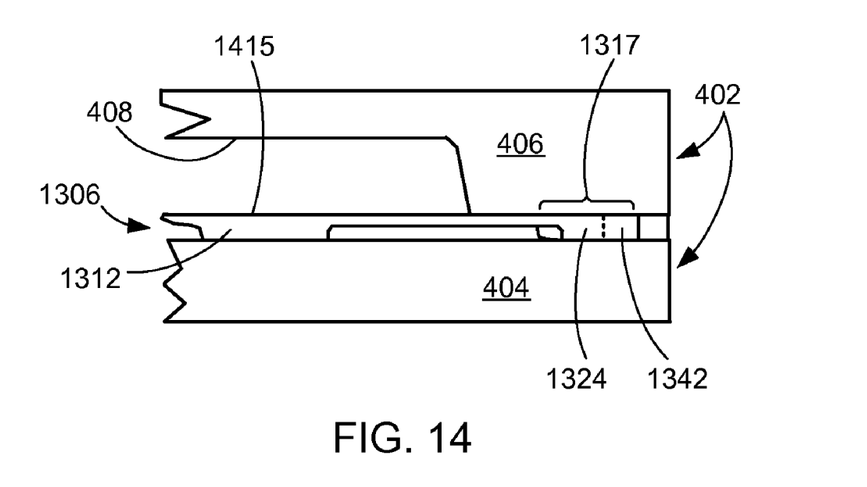
FIG. 14 is a cross-sectional view of the external interconnects along a line 14-14 of FIG. 13 in the mold chase.

Referring now to FIG. 14, therein is shown a cross-sectional view of the external interconnects 1300 along a line 14-14 of FIG. 13 in the mold chase 402. The cross-sectional view depicts one of the inner leads 1306 between the bottom chase 404 and the top chase 406. The first inner lead body 1312 is in the cavity 408 and the second inner lead body 1313 is not in the cavity 408. The dam bar 1324 and the protrusions 1342 are outside the cavity 408 between the bottom chase 404 and the top chase 406. The boundary of the protrusions 1342 with the dam bar 1324 is depicted by a dashed line.

As the integrated circuit package system 100 of FIG. 1 undergo molding, the top chase 406 and the bottom chase 404 clamps together holding the lead frame 102 of FIG. 1 in place. The clamping force may result in mold flash with some of the inner leads 1306 covered by the encapsulation 132 of FIG. 1. The increased width of the second inner lead body 1313 of the stiffening structure 1317 of FIG. 13 help resist, mitigate, or eliminate bending of the inner leads 1306 preventing mold flash of the first inner lead body 1312. The stiffening structure 1317 of FIG. 13 maintains a planar surface 1415 of each of the inner leads 1306.

Figure 15:
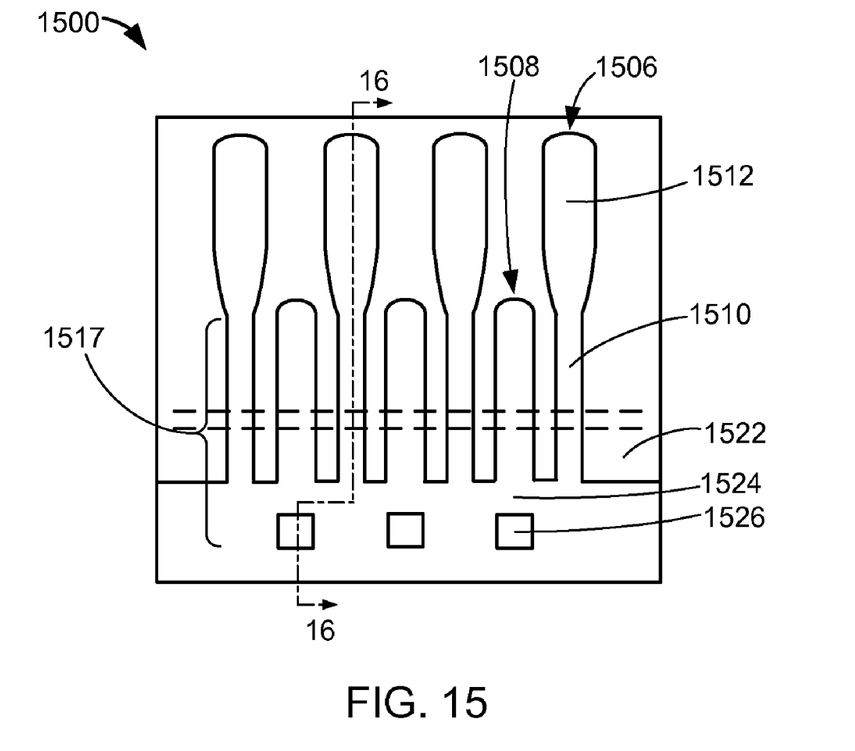
FIG. 15 is a plan view external interconnects in yet another alternative embodiment of the present invention.

Referring now to FIG. 15, therein is shown a plan view external interconnects 1500 in yet another alternative embodiment of the present invention. The external interconnects 1500 may be part of the integrated circuit package system 100 of FIG. 1. The plan view depicts the external interconnects 1500 including inner leads 1506 and outer leads 1508. The plan view also depicts a dam bar 1524, an opening 1522, and slots 1526, such as rectangular holes. The slots 1526 are adjacent to the outer leads 1508 providing more stress relief to the inner leads 1506 by not having the slots adjacent to the inner leads 1506.

Each of the inner leads 1506 has an inner lead tip 1510 and an inner lead body 1512, wherein the inner lead tip 1510 is attached to the dam bar 1524. A stiffening structure 1517 for each of the inner leads 106 includes the dam bar 1524 and the inner lead tip 1510. The inner leads 1506 and the outer leads 1508 have similar relationship to each other as the inner leads 106 of FIG. 1 and the outer leads 108 of FIG. 1.

Figure 16:
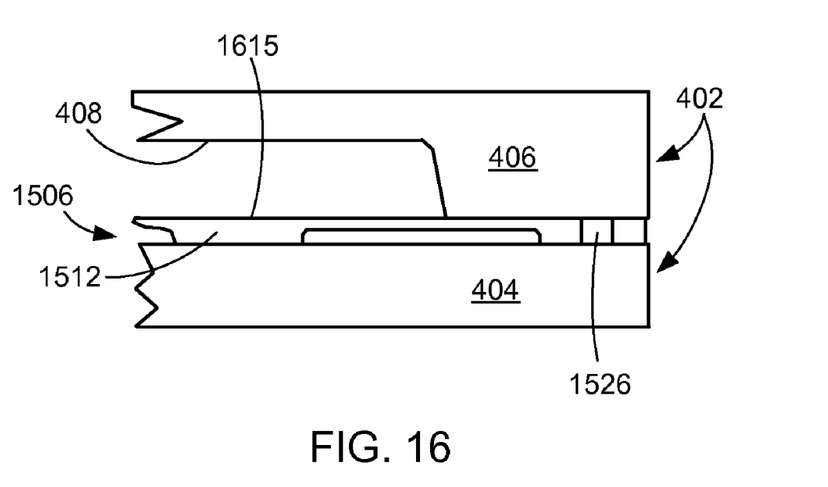
FIG. 16 is a cross-sectional view of the external interconnects along a line 16-16 of FIG. 15 in the mold chase.

Referring now to FIG. 16, therein is shown a cross-sectional view of the external interconnects 1500 along a line 16-16 of FIG. 15 in the mold chase 402. The cross-sectional view depicts one of the inner leads 1506 between the bottom chase 404 and the top chase 406. The inner lead body 1512 is in the cavity 408. The slots 1526 are outside the cavity 408 between the bottom chase 404 and the top chase 406.

As the integrated circuit package system 100 of FIG. 1 undergo molding, the top chase 406 and the bottom chase 404 clamps together holding the lead frame 102 of FIG. 1 in place. The clamping force may result in mold flash with some of the inner leads 1506 covered by the encapsulation 132 of FIG. 1. The slots 1526 adjacent to the outer leads 1508 of FIG. 15 along with the stiffening structure 1517 help resist, mitigate, or eliminate bending of the inner leads 1506 preventing mold flash of the inner lead body 1512. The stiffening structure 1517 of FIG. 15 maintains a planar surface 1615 of each of the inner leads 1506.

Figure 17:
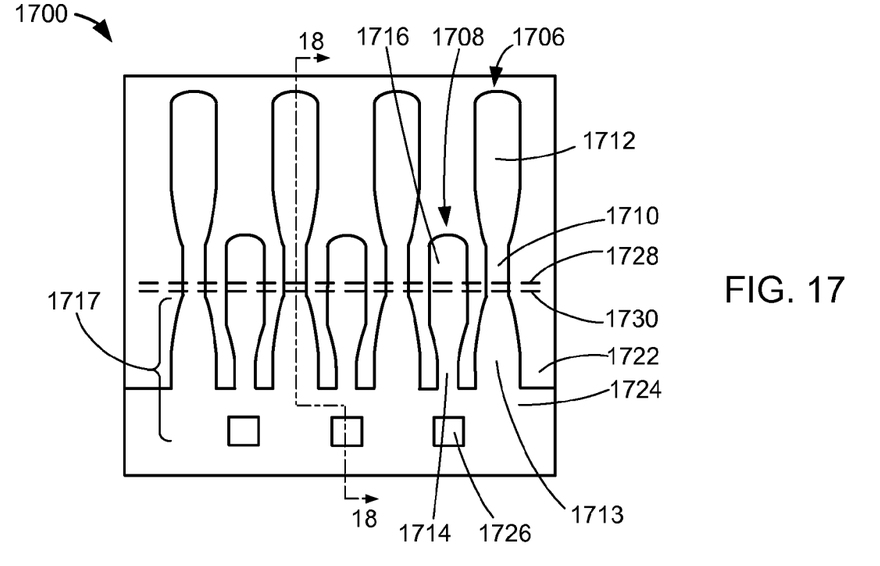
FIG. 17 is a plan view external interconnects in yet another alternative embodiment of the present invention.

Referring now to FIG. 17, therein is shown a plan view external interconnects 1700 in yet another alternative embodiment of the present invention. The external interconnects 1700 may be part of the integrated circuit package system 100 of FIG. 1. The plan view depicts the external interconnects 1700 including inner leads 1706 and outer leads 1708. The plan view also depicts a dam bar 1724, an opening 1722, and slots 1726, such as rectangular holes. The slots 1726 are adjacent to the outer leads 1708 providing more stress relief to the inner leads 1706 by not having the slots adjacent to the inner leads 1706.

Each of the inner leads 1706 has an inner lead tip 1710 between a first inner lead body 1712 and a second inner lead body 1713. Each of the outer leads 1708 has an outer lead tip 1714 and an outer lead body 1716. The outer lead tip 1714 attaches to the dam bar 1724 and the outer lead body 1716 is at the opposite end of the outer leads 1708.

The second inner lead body 1713 extends laterally such that the width of the second inner lead body 1713 is wider than the width of the inner lead tip 1710. The width of the outer lead body 1716 is wider than the width of the outer lead tip 1714. A stiffening structure 1717 for each of the inner leads 1706 includes the dam bar 1724, the location of the slots 1726, and the second inner lead body 1713. This plan view also depicts the second inner lead body 1713 below a singulation outline 1728 and a mold outline 1730.

As the integrated circuit package system 100 of FIG. 1 undergo molding, the top chase 406 of FIG. 4 and the bottom chase 404 of FIG. 4 clamps together holding the lead frame 102 of FIG. 1 in place. The clamping force may result in mold flash with some of the inner leads 1706 covered by the encapsulation 132 of FIG. 1. The slots 1726 adjacent to the outer leads 1708 and increased width of the second inner lead body 1713 help resist, mitigate, or eliminate bending of the inner leads 1706 preventing mold flash of the first inner lead body 1712. The inner leads 1706 and the outer leads 1708 have similar relationship to each other as the inner leads 106 of FIG. 1 and the outer leads 108 of FIG. 1.

Figure 18:
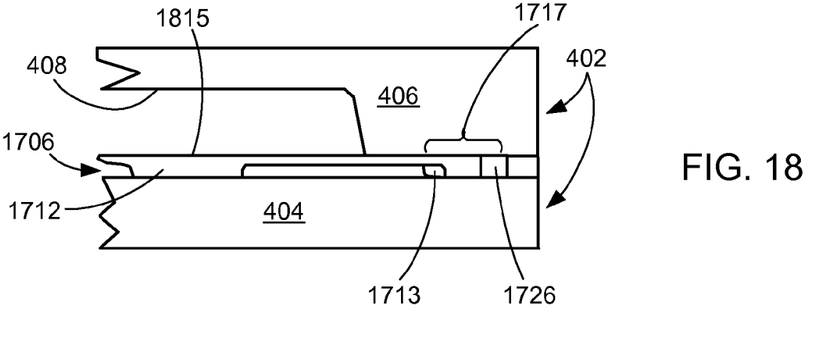
FIG. 18 is a cross-sectional view of the external interconnects along a line 18-18 of FIG. 17 in the mold chase.

Referring now to FIG. 18, therein is shown a cross-sectional view of the external interconnects 1700 along a line 18-18 of FIG. 17 in the mold chase 402. The cross-sectional view depicts one of the inner leads 1706 between the bottom chase 404 and the top chase 406. The first inner lead body 1712 is in the cavity 408 and the second inner lead body 1713 is not in the cavity 408. The second inner lead body 1713 and the slots 1726 are outside the cavity 408 between the bottom chase 404 and the top chase 406.

As the integrated circuit package system 100 of FIG. 1 undergo molding, the top chase 406 and the bottom chase 404 clamps together holding the lead frame 102 of FIG. 1 in place. The clamping force may result in mold flash with some of the inner leads 1706 covered by the encapsulation 132 of FIG. 1. The increased width of the second inner lead body 1713 and the slots 1726 adjacent to the outer leads 1708 of FIG. 17 along with the stiffening structure 1717 help resist, mitigate, or eliminate bending of the inner leads 1706 preventing mold flash of the first inner lead body 1712. The stiffening structure 1717 maintains a planar surface 1815 of each of the inner leads 1706.

Figure 19:
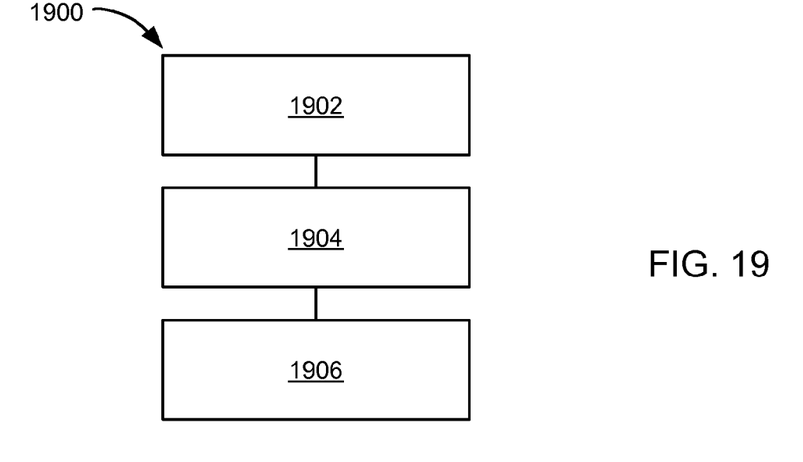
FIG. 19 is a flow chart of an integrated circuit package system for manufacture of the integrated circuit package system in an embodiment of the present invention.

Referring now to FIG. 19, therein is shown a flow chart of an integrated circuit package system 1900 for manufacture of the integrated circuit package system 100 in an embodiment of the present invention. The system 1900 includes forming a lead frame including forming an inner lead having a planar surface, the inner lead extending inwardly from the lead frame, and forming a stiffening structure integral with the lead frame for maintaining the planar surface in a block 1902; encapsulating the inner lead with an electrical connection to an integrated circuit die and with a first inner lead body of the inner lead exposed in a block 1904; and singulating the inner lead from the lead frame in a block 1906.

Yet other important aspects of the embodiments include that it valuably supports and services the historical trend of reducing costs, simplifying systems, and increasing performance.

These and other valuable aspects of the embodiments consequently further the state of the technology to at least the next level.

Thus, it has been discovered that the integrated circuit package system of the present invention furnishes important and heretofore unknown and unavailable solutions, capabilities, and functional aspects for improving reliability in systems. The resulting processes and configurations are straightforward, cost-effective, uncomplicated, highly versatile, and effective, can be implemented by adapting known technologies, and are thus readily suited for efficiently and economically manufacturing integrated circuit package system.

While the invention has been described in conjunction with a specific best mode, it is to be understood that many alternatives, modifications, and variations will be apparent to those skilled in the art in light of the aforegoing description. Accordingly, it is intended to embrace all such alternatives, modifications, and variations that fall within the scope of the included claims. All matters hithertofore set forth herein or shown in the accompanying drawings are to be interpreted in an illustrative and non-limiting sense.

What is claimed is:

1. A method of manufacture of an integrated circuit package system comprising:
   forming a lead frame including:
      forming an inner lead and an outer lead having planar surfaces and extending inwardly in the lead frame with:
         the inner lead having a planar surface width broader at an inner end portion inward in the lead frame and the outer lead having a consistent planar surface width or
         the outer lead having a planar surface width broader at the outer end portion inward in the lead frame and the inner lead having a planar surface width narrower between the inner end portion inward in the lead frame and an inner bottom portion outward in the lead frame;
      forming a protrusion in a slot adjacent to the inner lead;
   encapsulating an integrated circuit die electrically connected to the inner lead with the inner end portion inward in the lead frame exposed by a cavity in a mold chase and to the outer lead with the outer end portion inward in the lead frame exposed by a cavity in a mold chase; and
   singulating the outer lead and the inner lead from the lead frame.

2. The method as claimed in claim 1 further comprising forming a stiffening structure integral with the lead frame including forming an inner lead body of the inner lead.

3. The method as claimed in claim 1 wherein forming the lead frame includes:
   forming a dam bar between the slot and the inner lead; and
   forming a stiffening structure integral with the lead frame including:
      forming the dam bar by having the slot further away from the inner lead.

4. The method as claimed in claim 1 further comprising:
   forming the outer lead adjacent to the inner lead; and
   wherein forming a stiffening structure integral with the lead frame includes:
      forming a dam bar between the slot and the outer lead.

5. The method as claimed in claim 1 wherein singulating the inner lead from the lead frame includes:
   singulating a stiffening structure from the integrated circuit package system.

6. The method as claimed in claim 1 further comprising forming a stiffening structure integral with the lead frame including:
   forming a first inner lead body of the inner lead and a second inner lead body of the inner lead with an inner lead tip between the first inner lead body and the second inner lead body, the second inner lead body and the first inner lead body having the same width and a reduced width of the inner lead tip in between.

7. The method as claimed in claim 1 further comprising:
   forming an outer lead, having an outer lead body, adjacent to the inner lead; and
   encapsulating the outer lead with the outer lead body exposed.

8. The method as claimed in claim 1 wherein forming the inner lead includes:
   half etching the inner lead for forming an inner lead tip and a first inner lead body.

9. The method as claimed in claim 1 wherein forming the inner lead includes:
   half etching the inner lead for forming an inner lead tip between a first inner lead body and a second inner lead body.

10. A method of manufacture of an integrated circuit package system comprising:
    forming a lead frame including:
       forming an inner lead and an outer lead having planar surfaces and the inner lead and the outer lead extending inwardly in the lead frame with:
          the inner lead having a planar surface width broader at an inner end portion inward in the lead frame and the outer lead having a consistent planar surface width or
          the outer lead having a planar surface width broader at the outer end portion inward in the lead frame and the inner lead having a planar surface width narrower between the inner end portion inward in the lead frame and an inner bottom portion outward in the lead frame;
       forming a protrusion in a slot adjacent to the inner lead; and
       forming a stiffening structure integral with the lead frame for maintaining the planar surface;
    connecting an integrated circuit die with the inner lead and the outer lead;
    encapsulating the inner lead and the outer lead with a first inner lead body of the inner lead and the outer lead exposed by a cavity in a mold chase; and
    singulating the inner lead and the outer lead from the lead frame.

11. The method as claimed in claim 10 wherein:
    forming the lead frame includes:
       forming a dam bar between the slot and both the inner lead as well as the outer lead; and
    forming the stiffening structure integral with the lead frame includes:
       forming the dam bar by having the slot further away from the end away from the lead frame of the inner lead.

12. The method as claimed in claim 10 wherein forming the stiffening structure integral with the lead frame includes:
    forming a second inner lead body of the inner lead with an inner lead tip between the first inner lead body and the second inner lead body, the second inner lead body and the first inner lead body having the same width and a reduced width of the inner lead tip in between;
    forming a dam bar between the slot and both the inner lead and the outer lead; and
    forming a protrusion in the slot adjacent to the inner lead.

13. The method as claimed in claim 10 wherein forming the stiffening structure integral with the lead frame includes:
    forming a second inner lead body of the inner lead with an inner lead tip between the first inner lead body and the second inner lead body, the second inner lead body having a width wider than that of the inner lead tip; and
    forming a dam bar between the slot and the outer lead.

14. The method as claimed in claim 10 wherein forming the stiffening structure integral with the lead frame includes:
    forming a second inner lead body of the inner lead with an inner lead tip between the first inner lead body and the second inner lead body, the second inner lead body having a width wider than that of the inner lead tip; and
    forming an outer lead body from the outer lead and an outer lead tip outwardly adjacent to the outer lead body.

15. The method as claimed in claim 10 wherein:
    forming the stiffening structure integral with the lead frame includes:

forming a second inner lead body of the inner lead with an inner lead tip between the first inner lead body and the second inner lead body; and encapsulating the inner lead further includes:
    encapsulating the inner lead tip.

16. The method as claimed in claim 10 wherein forming the outer lead includes:

forming an outer lead tip and an outer lead body from the outer lead; and encapsulating the outer lead further includes:
    encapsulating the outer lead tip.

17. The method as claimed in claim 10 wherein forming the stiffening structure integral with the lead frame includes:

forming a second inner lead body of the inner lead with an inner lead tip between the first inner lead body and the second inner lead body, the second inner lead body having a width substantially the same as that of the inner lead tip;

forming an outer lead body from the outer lead and an outer lead tip outwardly adjacent to the outer lead body; and forming a dam bar between the slot and the outer lead.

18. The method as claimed in claim 10 wherein forming the outer lead includes:

half etching the outer lead for forming an outer lead tip and an outer lead body.

19. The method as claimed in claim 10 further comprising encapsulating the integrated circuit die.

\* \* \* \* \*